United States Patent
Ito et al.

(10) Patent No.: US 7,605,908 B2
(45) Date of Patent: Oct. 20, 2009

(54) NEAR-FIELD EXPOSURE MASK, NEAR-FIELD EXPOSURE APPARATUS, AND NEAR-FIELD EXPOSURE METHOD

(75) Inventors: Toshiki Ito, Kawasaki (JP); Natsuhiko Mizutani, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 237 days.

(21) Appl. No.: 11/864,097

(22) Filed: Sep. 28, 2007

(65) Prior Publication Data

US 2008/0079926 A1 Apr. 3, 2008

(30) Foreign Application Priority Data

Oct. 3, 2006 (JP) ............... 2006-272252

(51) Int. Cl.
G03B 27/02 (2006.01)
G03B 27/20 (2006.01)
G03B 27/62 (2006.01)
G03F 1/00 (2006.01)
G03C 5/04 (2006.01)

(52) U.S. Cl. .................... 355/78; 355/75; 355/76; 355/91; 430/5; 430/396

(58) Field of Classification Search ............... 355/53, 355/75, 78, 91; 430/5, 311, 396
See application file for complete search history.

(56) References Cited

U.S. PATENT DOCUMENTS

| 6,171,730 | B1 | 1/2001 | Kuroda et al. ............ 430/5 |
| 6,187,482 | B1 | 2/2001 | Kuroda et al. ............ 430/5 |
| 6,236,033 | B1 | 5/2001 | Ebbesen et al. ........ 250/216 |
| 6,632,593 | B2 | 10/2003 | Yamaguchi et al. ....... 430/322 |
| 7,050,144 | B2 | 5/2006 | Mizutani et al. .......... 355/19 |
| 7,144,682 | B2 | 12/2006 | Inao et al. .............. 430/311 |
| 7,144,685 | B2 | 12/2006 | Mizutani et al. ......... 430/311 |
| 7,279,253 | B2 | 10/2007 | Yamada et al. ............ 430/5 |
| 7,315,354 | B2 | 1/2008 | Mizutani ................ 355/76 |
| 2003/0103195 | A1 | 6/2003 | Tsuruma et al. .......... 355/53 |
| 2004/0166421 | A1* | 8/2004 | Yamaguchi et al. ......... 430/5 |

(Continued)

FOREIGN PATENT DOCUMENTS

JP        7-106229        4/1995

(Continued)

OTHER PUBLICATIONS

M.M. Alkaisi, "Sub-diffraction-limited patterning using evanescent near-field optical lithography," Applied Physics Letters, vol. 75, No. 22, Nov. 29, 1999, pp. 3560-3562.

*Primary Examiner*—Alan A Mathews
(74) *Attorney, Agent, or Firm*—Fitzpatrick, Cella, Harper & Scinto

(57) ABSTRACT

A near-field exposure mask includes a light blocking film having an opening smaller than a wavelength of exposure light, and a mask base material for holding the light blocking film. The near-field exposure mask is configured and positioned to effect exposure of an object to be exposed to near-field light generated corresponding to the opening during contact thereof with the object to be exposed. The mask base material is transparent to the exposure light and comprises a synthetic resin material having Young's modulus in a range of 1 GPa or more to 10 GPa or less.

9 Claims, 3 Drawing Sheets

U.S. PATENT DOCUMENTS

| | | |
|---|---|---|
| 2005/0227153 A1 | 10/2005 | Tsuruma et al. ................. 430/5 |
| 2005/0266321 A1 | 12/2005 | Tsuruma et al. ................. 430/5 |
| 2006/0003236 A1 | 1/2006 | Mizutani et al. ............... 430/5 |
| 2006/0003269 A1 | 1/2006 | Ito et al. ..................... 430/323 |
| 2006/0014108 A1 | 1/2006 | Ito et al. ..................... 430/322 |
| 2006/0110693 A1 | 5/2006 | Kuroda et al. ............... 430/394 |
| 2006/0124834 A1 | 6/2006 | Mizutani et al. ............ 250/216 |
| 2006/0160036 A1* | 7/2006 | Mizutani .................... 430/396 |
| 2007/0082279 A1 | 4/2007 | Mizutani et al. .............. 430/30 |
| 2007/0287100 A1 | 12/2007 | Mizutani et al. ............ 430/311 |

FOREIGN PATENT DOCUMENTS

| | | |
|---|---|---|
| JP | 2003-156834 | 5/2003 |

\* cited by examiner

NEAR-FIELD EXPOSURE MASK, NEAR-FIELD EXPOSURE APPARATUS, AND NEAR-FIELD EXPOSURE METHOD

FIELD OF THE INVENTION AND RELATED ART

The present invention relates to a near-field exposure mask, a near-field exposure apparatus including the near-field exposure mask, and a near-field exposure method using the near-field exposure mask.

With progresses of an increase in capacity of a semiconductor memory and speedup and high integration of a central processing unit (CPU), further fine photolithography is indispensable.

Generally, the limit of fine processing in a photolithographic apparatus is about ⅓ of a wavelength of light used.

For this reason, the wavelength of light used for the photolithographic apparatus is further shortened, so that it is possible to effect fine processing on the order of about 50 nm.

As described above, finer photolithography is advanced but with the shortened wavelength of light, there arise many problems regarding an increase in size of an exposure apparatus, development of a lens in the wavelength range, apparatus cost, cost of a corresponding resist, etc.

In order to perform fine processing with a resolution of not more than the wavelength of light used, a method in which near-field light is used has been proposed.

In near-field light lithography, there is no constraint of diffraction limit of light, so that it is possible to achieve a spatial resolution of not more than ⅓ of a wavelength of a light source.

Further, when a mercury lamp or a semiconductor laser is used as the light source, the light source is decreased in size, so that a resultant exposure apparatus is also small in size and advantageous in terms of a unit price thereof.

As a method of such near-field light lithography, Japanese Laid-Open Patent Application (JP-A) Hei 7-106229 has proposed a method in which evanescent wave is generated by a probe of optical fiber having an end sharpened by wet etching and is used for exposure.

In such a method, however, fine processing is performed by a single processing probe (or plural processing probes) according to vector scanning in a single stroke manner, so that a throughput is not sufficiently improved.

Thus, in JP-A 2003-156834 and Appl. Phys. Lett., 75, 3560 (1999), a near-field exposure method using one-shot exposure has been proposed.

In this one-shot near-field exposure method, the one-shot exposure is performed in a state in which a photomask having a light blocking film provided with a small opening narrower than a wavelength of a light source is brought into intimate contact with a resist. A distribution of intensity of near-field light is abruptly attenuated with a distance of the near-field light from the small opening of the mask, so that the intimate contact of the photomask with the resist is ensured in order to minimize the distance between the mask and the resist.

In JP-A 2003-156834, a near-field exposure method in which exposure is effected in an intimate state between a substrate to be exposed and an exposure mask comprising quartz glass as a mask base material and a light blocking film formed on the quartz glass has been disclosed.

However, it is difficult to bring the mask using a rigid material such as the quartz glass as the mask base material into contact with the substrate to be exposed at an entire surface having a large area when the presence of waving on the exposure mask and the substrate to be exposed is taken into consideration. In the case where a good intimate contact state is not ensured, a resultant pattern accuracy is influenced.

Further, in Appl. Phys. Lett., 75, 3560 (1999), a near-field exposure method in which a mask substrate is decreased in thickness to the extent that the mask substrate is elastically deformable and is then elastically deformed by applying thereto a controlled pressure to be brought into close contact with a substrate to be exposed has been disclosed.

However, this method requires a production process comprising many steps for producing a mask having a thin film structure and involves a possibility of breakage at a thin portion of the mask during application or release of the pressure.

As described above, the conventional near-field exposure masks have room for improvement in ensuring of intimate (close) contact of the mask with the substrate to be exposed in a large area, reduction of the steps of the production process, and enhancement of durability.

SUMMARY OF THE INVENTION

A principal object of the present invention is to provide a near-field exposure mask capable of ensuring intimate contact thereof with an object to be exposed in a large area by a simple mechanism even in the case of the presence of waving on the object to be exposed.

Another object of the present invention is to provide a near-field exposure apparatus including the near-field exposure mask and a near-field exposure method using the near-field exposure mask.

According to an aspect of the present invention, there is provided a near-field exposure mask comprising:

a light blocking film having an opening smaller than a wavelength of exposure light; and a mask base material for holding the light blocking film, wherein the near-field exposure mask is configured and positioned to effect exposure of an object to be exposed to near-field light generated corresponding to the opening during contact thereof with the object to be exposed, and wherein the mask base material is transparent to the exposure light and comprises a synthetic resin material having Young's modulus in a range of 1 GPa or more to 10 GPa or less.

According to another aspect of the present invention, there is provided a near-field exposure apparatus comprising:

a near-field exposure mask according to Claim 1 supported by a supporting mechanism; and a load applying mechanism for applying a load to the near-field exposure mask, wherein the near-field exposure mask is deformed by load application by the load applying mechanism to bring the near-field exposure mask into intimate contact with an object to be exposed, and wherein exposure of the object to be exposed is effected by using near-field light generated corresponding to an opening, formed in the near-field exposure mask, smaller than the wavelength of the exposure light.

According to a further aspect of the present invention, there is provided a near-field exposure method comprising:

bringing a near-field exposure mask according to Claim 1 into intimate contact with an object to be exposed; and exposing the object to be exposed to near-field light generated corresponding to an opening, formed in the near-field exposure mask, smaller than the wavelength of the exposure light.

In the near-field exposure mask according to the present invention, the mask base material comprises a synthetic resin material which is transparent to the exposure light and has a Young's modulus in a range of 1 GPa or more and 10 GPa or less. When the near-field exposure mask is used, it is possible to ensure intimate contact of the mask with the object to be exposed in a large area with a simple mechanism even in the case of the presence of waving on the object to be exposed.

These and other objects, features and advantages of the present invention will become more apparent upon a consideration of the following description of the preferred embodiments of the present invention taken in conjunction with the accompanying drawings.

DETAILED DESCRIPTION OF THE PREFERRED EMBODIMENTS

Hereinbelow, a near-field exposure mask according to an embodiment of the present invention will be described with reference to the drawings.

Figure 1:
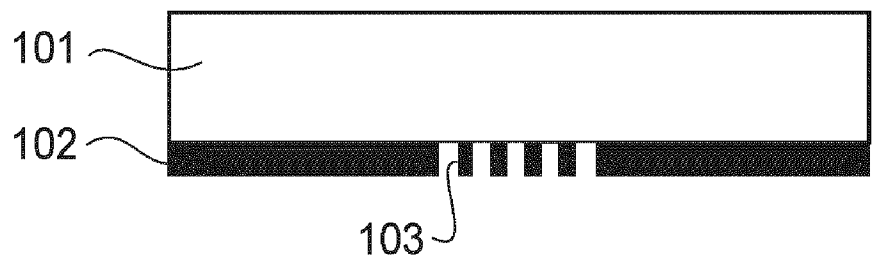
FIG. 1 is a schematic view showing a fundamental structure of a near-field exposure mask according to the present invention.

FIG. 1 is a schematic view showing a fundamental structure of the near-field exposure mask of the present invention.

In the near-field exposure mask in this embodiment, a mask base material comprises a synthetic resin material which is transparent to exposure light and has a Young's modulus in a range of 1 GPa or more and 10 GPa or less.

When the Young's modulus is less than 1 GPa, the exposure mask is easily deformed, so that a pattern accuracy obtained by exposure is lowered. On the other hand, when the Young's modulus exceeds 10 Gpa, the exposure mask is less liable to be deformed, so that waving followability of a substrate to be exposed is insufficient.

The near-field exposure mask of the present invention includes the above described synthetic resin mask base material 101, a light blocking film 102, and a minute pattern 103 containing at least one opening, having a width smaller than a wavelength of exposure light, formed in the light blocking film 102. The near-field exposure mask of the present invention is used for performing exposure of the substrate to be exposed (object to be exposed) to near-field light generated corresponding to the opening during contact thereof with the object to be exposed.

The synthetic resin material used in the present invention may include known materials such as polyester resin, acrylic resin, plastic film, plastic sheet, and the like.

Examples of the polyester resin may include polyolefins such as polyethylene, polypropyrene, cyclic polyolefin, and polyvinyl chloride; polyethylene terephthalate; polybutyrene terephthalate; polyethylene naphthalate; etc.

The acrylic resin may include polymethyl methacrylate and the like.

The plastic film and the plastic sheet may include those of polystyrene, polycarbonate, polyimide, etc.

From the viewpoints of transparency, heat-resistivity, and chemical resistance, it is preferable that cyclic polyolefin, polyethylene terephthalate, polycarbonate, and polymethyl methacrylate are used. More specifically, cyclic polyolefins such as "ARTON" (registered trademark) mfd. by JSR Corporation, and "ZEONOR" and "ZEONEX" (registered trademark) mfd. by ZEON Corporation; polyethylene terephthalate such as "Lumirror" (registered trademark) mfd. by Toray Industries, Inc., and "Tetoron" (registered trademark) mfd. by Teijin DuPont Films Japan Limited; and Polycarbonate such as "Panlite" (registered trademark) mfd. by TEIJIN CHEMICALS LTD. may preferably be used.

In a preferred embodiment of the present invention, a synthetic resin material having a Young's modulus in a range of 1 GPa or more and 10 GPa or less and capable of transmitting exposure light therethrough is selected and used as the mask base material 101.

A thickness of the synthetic resin material is not particularly limited but may preferably be 0.1-400 µm, more preferably 5-300 µm, optimally 10-200 µm.

When the thickness is less than 0.1 µm (too thin), a mechanical strength of the mask is small, and when the thickness exceeds 400 µm (too thick), transparency to exposure light is undesirably lowered. When the thickness is in the range of 10-200 µm, the mechanical strength and the transparency are well balanced.

The light blocking film may preferably be formed of a material, such as metal, a semiconductor, or the like, having high absorption with respect to exposure light. More specifically, Cr, Al, Si and the like can be used but Si represented by amorphous Si may particularly preferably be used.

The near-field exposure mask of the present invention requires a small number of steps of its production process, thus resulting in an inexpensive near-field exposure mask.

By using the near-field exposure mask of the present invention, it is possible to realize a near-field exposure apparatus and a near-field exposure method which employ a simple apparatus structure and are inexpensive.

The near-field exposure apparatus of the present invention includes a near-field exposure mask supported by a supporting mechanism and a load applying mechanism for applying a load to the near-field exposure mask.

In the near-field exposure apparatus, the above described near-field exposure mask of the present invention is brought into intimate (close) contact with the object to be exposed by being deformed by application of the load by means of the load applying mechanism and the object to be exposed is exposed to near-field light generated corresponding to the opening, smaller than the wavelength of exposure light, formed with respect to the near-field exposure mask.

The load applying mechanism of the near-field exposure apparatus of the present invention can be constituted by a mechanism for applying an air pressure or a fluid pressure to the near-field exposure mask from an exposure light incident side.

In the near-field exposure method of the present invention, the above described near-field exposure mask of the present invention is deformed and brought into intimate contact with the object to be exposed and the object to be exposed is exposed to near-field light generated corresponding to the opening, smaller than the wavelength of exposure light, formed with respect to the near-field exposure mask.

Next, a further preferred embodiment in which an intermediate layer is formed between the mask base material and the light blocking film will be described.

Figure 2:
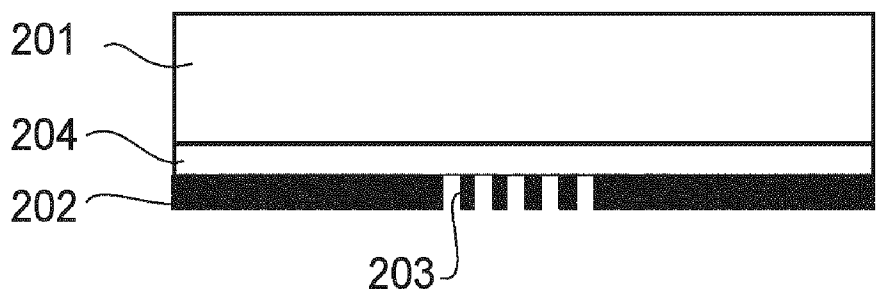
FIG. 2 is a schematic view showing a constitutional embodiment in which an intermediate layer is formed between a mask base material and a light blocking film of the near-field exposure mask of the present invention.

FIG. 2 shows a structural example of this embodiment in which the intermediate layer is formed between the mask base material and the light blocking film.

As shown in FIG. 2, it is preferable that a layer of a material, transparent to exposure light, having a linear expansion coefficient α smaller than that of a mask base material 201 is formed as an intermediate layer 204 between the mask base material 201 and a light blocking film 202. That is, the near-field exposure mask of the present invention can contain one or more layer of the material, transparent to exposure light, having the linear expansion coefficient smaller than that of the mask base material and being interposed between the mask base material and the light blocking film.

By providing the intermediate layer 204, it is possible to further alleviate thermal deformation of the mask due to heat generation by light absorption of the light blocking film or a resist during exposure.

As a material for the intermediate layer 204, it is possible to use a silicon oxide film such as $SiO_2$ film or spin-on glass, a silicon nitride film such as SiN film, and silicon oxide film such as SiON film.

A thickness of the intermediate layer 204 is not particularly limited but may preferably be 5-5000 nm, more preferably 10-1000 nm, particularly preferably 20-500 nm.

When the thickness is too thin, a thermal deformation alleviating effect is small, and when the thickness is too thick, waving followability of the substrate to be exposed is undesirably lowered.

According to the near-field exposure mask including the intermediate layer in this embodiment, it is possible to particularly suppress the thermal deformation to improve processing accuracy.

Hereinbelow, the present invention will be described in detail based on some specific embodiments.

Embodiment 1

A production process of a near-field exposure mask and the near-field exposure mask produced through the production process will be described.

Figure 3:
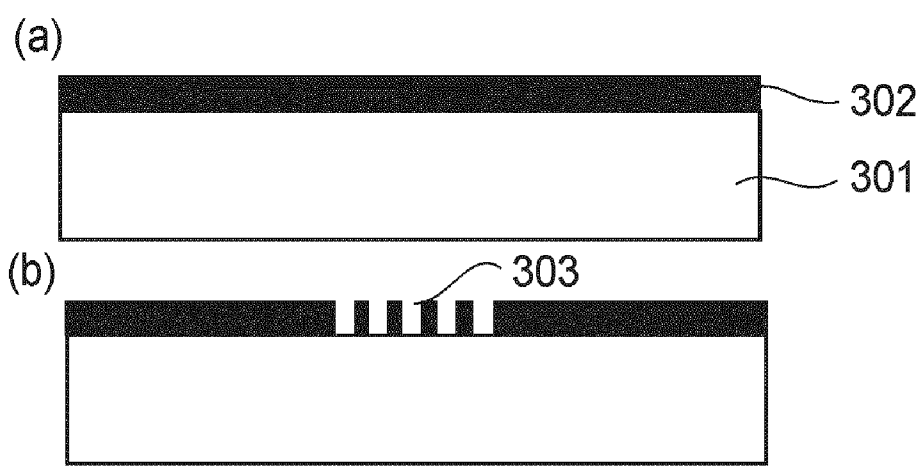
FIGS. 3(a) and 3(b) and FIGS. 4(a) to 4(c) are schematic views for illustrating production processes of near-field exposure mask in Embodiment 1 and Embodiment 2, respectively, of the present invention.

FIGS. 3(a) and 3(b) are schematic views for illustrating the production process of the near-field exposure mask in this embodiment.

In this embodiment, first, on a mask base material 301, a light blocking film 302 is formed in a film by using a synthetic resin material which is transparent to exposure light and has a Young's modulus in a range of 1 GPa or more and 10 GPa or less as described in the above mentioned embodiment (FIG. 3(a)). The film formation is performed by sputtering, electron beam deposition, resistance heating deposition, chemical vapor deposition, or the like.

Then, a minute (fine) pattern 303 is formed with respect to the light blocking film 302 (FIG. 3(B)).

The patterning of the pattern 303 is performed by etching using, as a mask, a resist subjected to direct processing using a focused ion beam (FIB) processing apparatus or patterning by an electron beam (EB) lithographic apparatus.

In this embodiment, a width of an opening of the minute pattern 303 is smaller than a wavelength of an exposure light source used for near-field exposure.

In the etching using the EB lithographic apparatus, an EB resist is directly applied onto the light blocking film 303 or applied onto the light blocking film 303 via a hard mask layer, such as an oxide layer or a metal layer, formed on the light blocking film 303.

The etching of the light blocking film 303 and the hard mask layer may be performed by dry etching or wet etching.

The dry etching is performed by using halogenated gas such as $CF_4$, $C_2F_6$, $C_3F_8$, $CCl_2F_2$, $CCl_4$, $CBrF_3$, $BCl_3$, $PCl_3$, $SF_6$, $Cl_2$, HCl, or HBr.

The wet etching is performed by using an alkali aqueous solution such as an aqueous solution of potassium hydroxide or tetramethylammonium hydroxide.

The dry etching is capable of forming a vertical and minute opening pattern, thus being particularly preferable in the present invention.

By the above described production process, a near-field exposure mask including the light blocking film having the opening smaller than the wavelength of the exposure light and the mask base material, for holding the light blocking film, comprising the synthetic resin material which is transparent to the exposure light and has the Young's modulus in the range of 1 GPa or more and 10 GPa or less is obtained as shown in FIG. 1.

Embodiment 2

A production process of a near-field exposure mask including an intermediate layer and the near-field exposure mask produced through the production process will be described.

Figure 4:
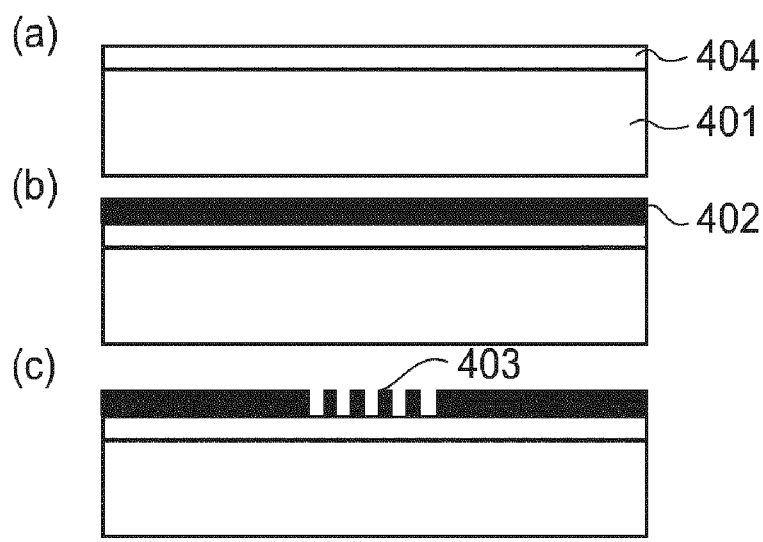

FIGS. 4(a), 4(b) and 4(c) are schematic views for illustrating the production process of the near-field exposure mask including the intermediate layer.

A mask base material 401, film formation of a light blocking film 402, and formation of a minute pattern 403 are similar to those in Embodiment 1, so that description thereof will be omitted.

In this embodiment, on the mask base material 401, an intermediate layer 404 is formed in a film (FIG. 4(a)).

In the case where $SiO_2$ or SiN is employed as a material for the intermediate layer, the film formation is performed by sputtering, electron beam deposition, resistance heating deposition, chemical vapor deposition, or the like.

In the case where spin-on glass is used as the material for the intermediate layer, the film formation is performed by spin coating, spray coating, vapor-phase deposition, dipping, or the like and thereafter by thermal curing with a hot plate or an oven.

By the above described production process, a near-field exposure mask including the light blocking film having the opening smaller than the wavelength of the exposure light, the intermediate layer, and the mask base material, for holding the light blocking film via the intermediate layer, comprising the synthetic resin material which is transparent to the exposure light and has the Young's modulus in the range of 1 GPa or more and 10 GPa or less is obtained as shown in FIG. 2.

Embodiment 3

A near-field exposure method using a near-field exposure mask according to the present invention will be described.

FIGS. 5(a) to 5(d) are schematic views for illustrating the near-field exposure method of this embodiment.

Figure 5:
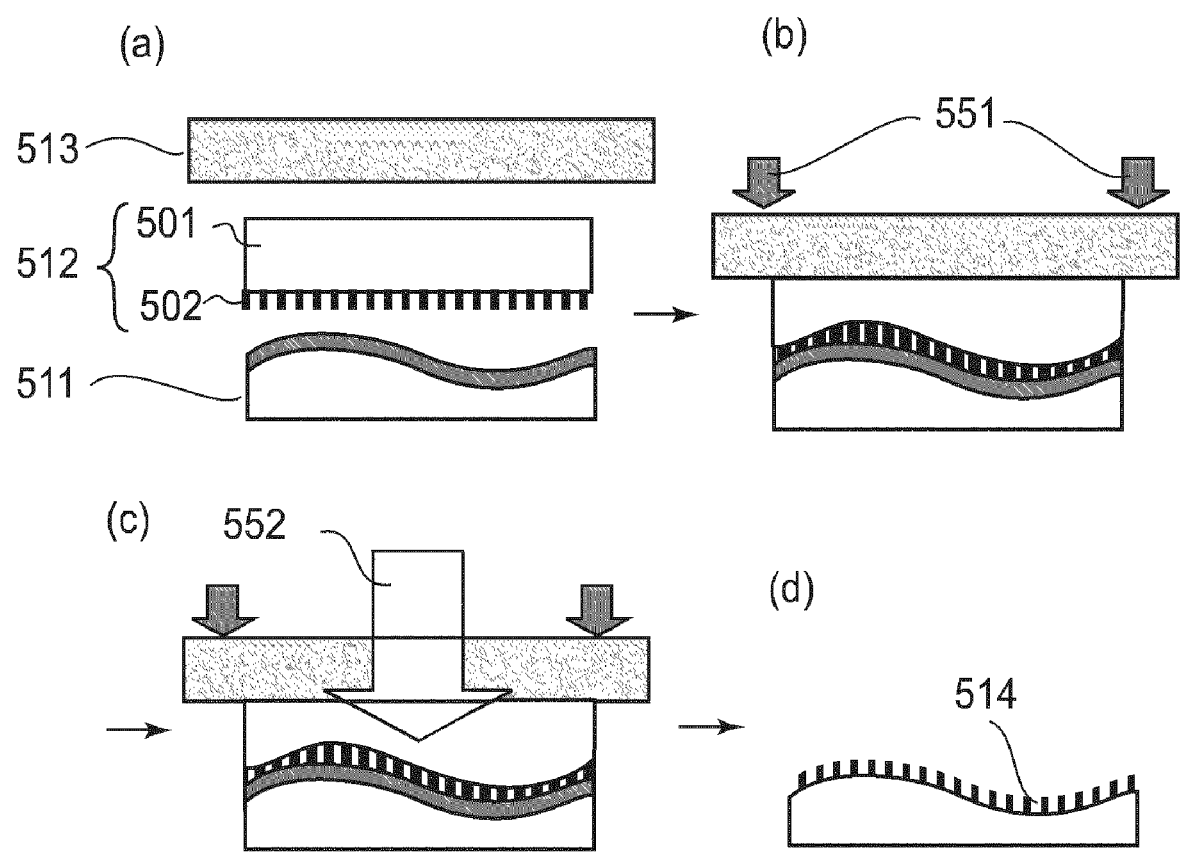
FIGS. 5(a) to 5(d) are schematic views for illustrating a near-field exposure method in Embodiment 3 of the present invention.

On a mask base material 501 side of a near-field exposure mask 512, a quartz glass 513 as a rigid member transparent to exposure light is provided and on a light blocking film 502 side of the near-field exposure mask 512, a resist-coated substrate to be exposed 511 is provided (FIG. 5(a)). The transparent rigid member is, however, not limited to the quartz glass 513. In this embodiment, the quartz glass 513 functions as an exposure mask supporting mechanism.

The resist is usable in this embodiment irrespective of the type thereof such as a positive type or a negative type so long as the resist has photosensitivity with respect to light from a light source. Examples of the positive resist may include diazonaphthoquinone-novolac resist and a chemically amplified positive resist. Examples of the negative resist may include a chemically amplified resist, a photo cation polymerizable resist, a photo radical polymerizable resist, polyhydroxystyrene-bisazide resist, cyclized rubber-bisazide resist, polyvinyl cinnamate resist, and the like.

When the chemically amplified positive resist or the chemically amplified negative resist is used, it is possible to form a pattern with a small line edge roughness, so that these resists may particularly preferably be used in the present invention.

Then, a load 551 is applied to the above prepared structure so as not to block exposure light (FIG. 5(b)).

Generally, the synthetic resin material has a higher flexibility than that of the quartz glass, so that the synthetic resin material follows waving of a surface of the substrate to be exposed and closely contacts the surface of the substrate to be exposed in a large area while being locally deformed. The waving of the surface of the substrate to be exposed is attributable to flatness of the substrate to be exposed, e.g., about 1000 nm in the case of a silicon wafer (wafer substrate) having a diameter of 300 mm or attributable to thickness non-uniformity of the resist. In FIGS. 5(a) to 5(d), the waving of the substrate to be exposed is exaggerated for the purpose of illustration.

In this embodiment, as a mechanism for bringing the near-field exposure mask into intimate contact with the substrate to be exposed, a load applying mechanism is used but a mechanism for applying a pressure by using a fluid may also be utilized.

The resultant structure is exposed to near-field light in a state in which the near-field exposure mask and the substrate to be exposed are brought into intimate contact with each other in a pattern-forming area (FIG. 5(c)).

As a light source for the near-field light, it is possible to use a known light source. Examples of the light source may include a carbon-arc lamp, a mercury (vapor)-arc lamp, a high-pressure mercury lamp, a xenon lamp, a YAG laser, an Ar iron laser, a semiconductor laser, and F2 excimer laser, an ArF excimer laser, a KrF excimer laser, visible radiation, and the like. These light sources may be used singly or in combination of plural light sources. In the present invention, the high-pressure mercury lamp and the semiconductor laser may particularly preferably be used in terms of low cost and high output.

By the exposure, the near-field light is generated from an opening of the light blocking film constituting the near-field exposure mask, so that a latent image of a pattern is transferred onto the resist on the substrate to be exposed.

The resist layer subjected to the near-field exposure is, after the substrate to be exposed is heated as desired, subjected to development with an alkali aqueous solution, an aqueous developing liquid, an organic solvent, or the like (FIG. 5(d)).

As the developing method, it is possible to use, e.g., dipping, spraying, brushing, slapping, and the like. As a result, a near-field resist pattern is formed.

The thus formed resist pattern is used as a mask and the substrate (e.g., a semiconductor substrate of silicon, germanium, or the like) is subjected to dry etching or wet etching, followed by a semiconductor process such as metal deposition, life-off, plating, or the like to process the substrate. As a result, it is possible to produce a desired device on the substrate.

Embodiment 4

An embodiment in which a near-field exposure mask is actually prepared is shown below.

As the mask base material 301 shown in FIGS. 3(a) and 3(b), a 188 µm-thick film ("ZEONOR", mfd. by ZEON Corporation) was used. This material has a Young's modulus of 2.1 GPa. On the mask base material 301, a 50 nm-thick light blocking film 302 of a-Si was formed by sputtering.

Onto the light blocking film 302, a 70 nm-thick electron beam resist ("ZEP520A", mfd. by ZEON Corporation) was directly applied and subjected to electron beam lithography and development.

After the electron beam lithography, the light blocking film 302 was etched by dry etching using a mixed gas of $SF_6$ and $CHF_3$ to obtain a minute pattern 303. In this embodiment, the minute pattern 303 was a line-and-space pattern with a half pitch (hp) of 80 nm and a half pitch (hp) of 45 nm.

Through the above described steps, a near-field exposure mask was obtained.

Embodiment 5

An experimental result of near-field exposure using the near-field exposure mask prepared in Embodiment 4 is shown below.

On a mask base material 501 side of a near-field exposure mask 512, a 1 mm-thick quartz glass 513 as a rigid member transparent to exposure light was provided and on a light blocking film 502 side of the near-field exposure mask 512, a resist-coated substrate to be exposed 511 was provided (FIG. 5(a)). The substrate used in this embodiment was a silicon wafer having a diameter of 100 mm.

Figure 6:
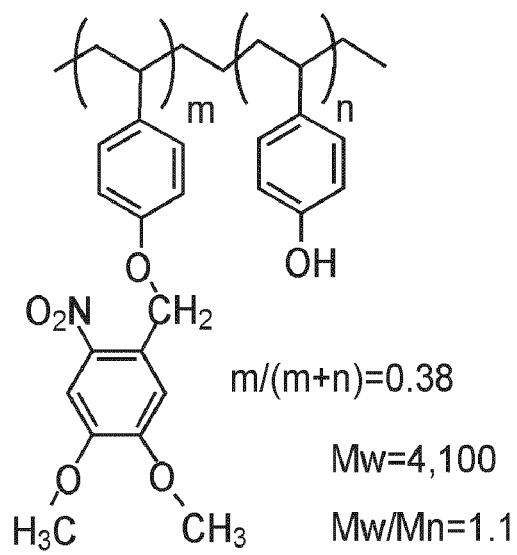
FIG. 6 is a schematic view for illustrating a resist material in Embodiment 5 of the present invention.

As a resist, a solution of a compound shown in FIG. 6 in propyrene glycol monomethyl ether acetate was used. Onto the silicon substrate, the resist was applied by spin coating and baked on a hot plate for 90 sec at 90° C. to prepare the substrate to be exposed 511. The thickness of the resist was 130 nm.

A load 551 was applied so as not to block exposure light (FIG. 5(b)).

Exposure was performed in a state in which the near-field exposure mask and the substrate to be exposed were brought into intimate contact with each other in a pattern forming area (i.e., in a state in which there was no non-contact area) (FIG. 5(c)). As a light source for near-field light, a high-pressure mercury lamp equipped with a band-pass filter for i-line (wavelength: 365 nm) was used. An illuminance for i-line was about 85 $mJ/cm^2$ at an upper surface of the mask.

Figure 7:
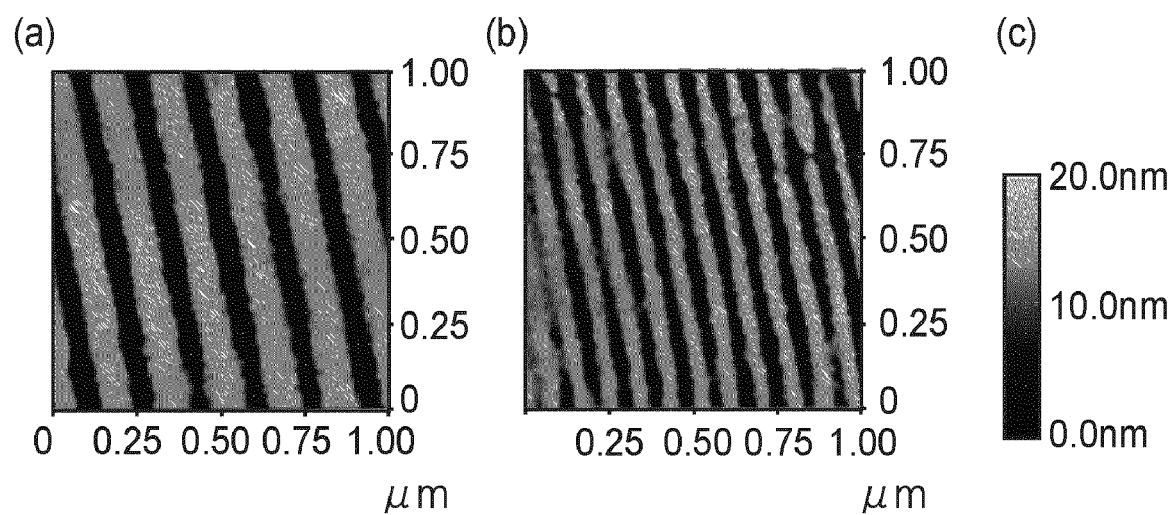
FIGS. 7(a) to 7(c) are schematic views for illustrating a near-field resist pattern in Embodiment 5 of the present invention.

The substrate to be exposed 511 exposed to the near-field light was subjected to development by being dipped in a 2.38%-aqueous solution of tetramethylammonium hydroxide for 10 sec at room temperature. Atomic force microscopic images of the thus formed near-field resist pattern 514 were shown in FIGS. 7(a) and 7(b). At an exposure time of 114.5 sec, a pattern with a half pitch (hp) of 80 nm and a depth of about 10 nm was obtained (FIG. 7(a)) and at an exposure time of 79.5 sec, a line-and-space pattern with a half pitch (hp) of 45 nm and a depth of about 10 nm was obtained (FIG. 7(b)).

Comparative Embodiment

A near-field exposure mask was prepared in the same manner as in Embodiment 4 except that a 100 nm-thick quartz glass substrate was used as the mask base material 301 shown in FIGS. 3(a) and 3(b). The quartz glass substrate has a Young's modulus of 72 GPa.

When exposure and development were performed in the same manner as in Embodiment 5 except for using the above prepared near-field exposure mask, an area in which the mask and the substrate to be exposed were not brought into intimate contact each other was present between the mask and the substrate to be exposed. As a result, resist patterns with processing accuracy as in Embodiment 5 were not obtained.

While the invention has been described with reference to the structures disclosed herein, it is not confined to the details set forth and this application is intended to cover such modifications or changes as may come within the purpose of the improvements or the scope of the following claims.

This application claims priority from Japanese Patent Application No. 272252/2006 filed Oct. 3, 2006, which is hereby incorporated by reference.

What is claimed is:

1. A near-field exposure mask comprising:
   a light blocking film having an opening smaller than a wavelength of exposure light; and
   a mask base material for holding said light blocking film,
   wherein said near-field exposure mask is configured and positioned to effect exposure of an object to be exposed to near-field light generated corresponding to the opening during contact thereof with the object to be exposed, and
   wherein said mask base material is transparent to the exposure light and comprises a synthetic resin material having Young's modulus in a range of 1 GPa or more to 10 GPa or less.

2. A mask according to claim 1, wherein said mask base material is selected from the group consisting of cyclic polyolefin, polyethylene terephthalate, polycarbonate, and polymethyl methacrylate.

3. A mask according to claim 1, wherein said near-field exposure mask further comprises at least one intermediate layer, disposed between said light blocking film and said mask base material, which has a linear expansion coefficient smaller than that of said mask base material and is transparent to the exposure light.

4. A mask according to claim 3, wherein said intermediate layer is selected from the group consisting of $SiO_2$, SiN, or spin-on glass.

5. A near-field exposure apparatus comprising:
   a near-field exposure mask according to claim 1 supported by a supporting mechanism; and
   a load applying mechanism for applying a load to said near-field exposure mask,
   wherein said near-field exposure mask is deformed by load application by said load applying mechanism to bring said near-field exposure mask into intimate contact with an object to be exposed, and
   wherein exposure of the object to be exposed is effected by using near-field light generated corresponding to an opening, formed in said near-field exposure mask, smaller than the wavelength of the exposure light.

6. An apparatus according to claim 5, wherein said load applying mechanism comprises a mechanism for applying a pressure to said near-field exposure mask from an incident side of the exposure light by using a fluid.

7. A near-field exposure method comprising:
   bringing a near-field exposure mask according to claim 1 into intimate contact with an object to be exposed; and
   exposing the object to be exposed to near-field light generated corresponding to an opening, formed in the near-field exposure mask, smaller than the wavelength of the exposure light.

8. A resist pattern forming method comprising:
   effecting exposure by a near-field exposure method according to claim 7 by using an object to be exposed comprising a substrate and a resist formed on the substrate; and
   developing the resist exposed to the near-field light to form a resist pattern.

9. A production process of a device, comprising:
   forming a resist pattern by a resist pattern forming method according to claim 8; and
   etching the substrate by using the resist pattern on the substrate as a mask to produce a device on the substrate.

* * * * *